United States Patent
Ossimitz (10) Patent No.: US 7,501,701 B2
(45) Date of Patent: Mar. 10, 2009

(54) REWIRING SUBSTRATE STRIP HAVING A PLURALITY OF SEMICONDUCTOR COMPONENT POSITIONS

(75) Inventor: Peter Ossimitz, München (DE)

(73) Assignee: Infineon Technologies AG, Munich (DE)

( * ) Notice: Subject to any disclaimer, the term of this patent is extended or adjusted under 35 U.S.C. 154(b) by 134 days.

(21) Appl. No.: 11/456,985

(22) Filed: Jul. 12, 2006

(65) Prior Publication Data

US 2007/0063311 A1    Mar. 22, 2007

Related U.S. Application Data

(63) Continuation of application No. PCT/DE2004/002840, filed on Dec. 31, 2004.

(30) Foreign Application Priority Data

Jan. 13, 2004    (DE)    ........................ 10 2004 001 956

(51) Int. Cl.
*H01L 23/34* (2006.01)
*H01L 23/053* (2006.01)

(52) U.S. Cl. ........................ 257/723; 257/701; 257/773; 257/776

(58) Field of Classification Search ................ 257/776, 257/773, 701, 723, E23.003; 438/113
See application file for complete search history.

(56) References Cited

U.S. PATENT DOCUMENTS

| | | | |
|---|---|---|---|
| 3,657,611 A | 4/1972 | Yoneda | 317/234 R |
| 3,803,483 A * | 4/1974 | McMahon, Jr. | 324/538 |
| 4,467,400 A | 8/1984 | Stopper | 361/403 |
| 4,702,967 A | 10/1987 | Black et al. | 428/620 |
| 4,929,516 A | 5/1990 | Pryor et al. | 428/620 |
| 5,315,241 A | 5/1994 | Ewers | 324/158 R |
| 5,559,817 A | 9/1996 | Derkits, Jr. et al. | 372/36 |
| 5,608,335 A | 3/1997 | Tailliet | 324/763 |
| 5,897,334 A * | 4/1999 | Ha et al. | 438/107 |
| 5,901,901 A | 5/1999 | Schneegans et al. | 228/254 |
| 6,300,167 B1 | 10/2001 | Raleigh et al. | 438/122 |
| 6,366,110 B1 | 4/2002 | Buck | 324/765 |
| 6,380,729 B1 | 4/2002 | Smith | 324/158.1 |
| 6,479,887 B1 * | 11/2002 | Yoon et al. | 257/666 |
| 6,727,587 B2 | 4/2004 | Riedl | 257/748 |

(Continued)

FOREIGN PATENT DOCUMENTS

DE    3406542    2/1984

(Continued)

OTHER PUBLICATIONS

International Search Report W/English translation of Preliminary Report on Patentability, PCT/US2004/002840, 19 pgs.

*Primary Examiner*—Nitin Parekh
(74) *Attorney, Agent, or Firm*—Banner & Witcoff, Ltd.

(57) ABSTRACT

A rewiring substrate strip (100) has a plurality of semiconductor component positions (2) for semiconductor components (3). The semiconductor component positions are arranged in rows and columns. A plurality of semiconductor component positions (2) can be combined to form a component group (5). The semiconductor components (3) of a component group (5) can be arranged with respect to one another in such a way that a single characteristic component edge (22) of a single semiconductor component is oriented with respect to one of the sawing tracks (12).

12 Claims, 4 Drawing Sheets

U.S. PATENT DOCUMENTS

| | | | |
|---|---|---|---|
| 2001/0042901 A1 | 11/2001 | Maruyama | 257/620 |
| 2003/0201532 A1 | 10/2003 | Riedl | 257/734 |
| 2003/0237061 A1 | 12/2003 | Miller et al. | 716/4 |

FOREIGN PATENT DOCUMENTS

| | | |
|---|---|---|
| DE | 3823347 | 7/1988 |
| DE | 19528441 | 8/1995 |
| DE | 19606101 | 2/1996 |
| DE | 10124141 | 5/2001 |
| JP | 04056244 | 2/1992 |
| JP | 08115928 | 5/1996 |
| WO | 03075344 | 9/2003 |

\* cited by examiner

PRIOR ART

REWIRING SUBSTRATE STRIP HAVING A PLURALITY OF SEMICONDUCTOR COMPONENT POSITIONS

CROSS-REFERENCE TO RELATED APPLICATION

This application is a continuation of co-pending International Application No. PCT/DE2004/002840 filed Dec. 31, 2004 which designates the United States, and claims priority to German application number DE 10 2004 001 956.8 filed Jan. 13, 2004.

TECHNICAL FIELD

The invention relates to a rewiring substrate strip having a plurality of semiconductor component positions and semiconductor components of the rewiring substrate strip which are arranged in rows and columns on the rewiring substrate strip.

BACKGROUND

Miniaturization of the product housing size produced is increasingly being sought for semiconductor components. For this purpose, the number of external contacts is reduced to a minimum in an aim to avoid as many external contacts of a semiconductor component as possible which have hitherto been provided for test purposes, optimization purposes and analysis purposes. Such a reduction of the external contacts is associated with the disadvantage that external contacts for internal test and analysis purposes are no longer provided externally on the housing. Although this results in smaller product housings, significant restrictions in the analysis and the testability of such semiconductor components also arise, disadvantageously, at the same time. The associated risks with regard to the yield of functional semiconductor components from a rewiring substrate strip cannot be compressed by further improved manufacturing methods.

In addition, testing semiconductor components by making contact with their residual external contacts by means of measuring tips constitutes a further problem, especially as damage or deformation of the external contacts by measuring tips cannot be precluded. Damage or deformation of external contacts of the production component can lead to problems during soldering in the course of further processing. Transfer of a soft material of the external contacts to the hardened measuring contacts or measuring tips is not precluded in this case and may, moreover, lead to contamination of the measuring tips by residues, which consequently entails enormous test problems.

Figure 4:
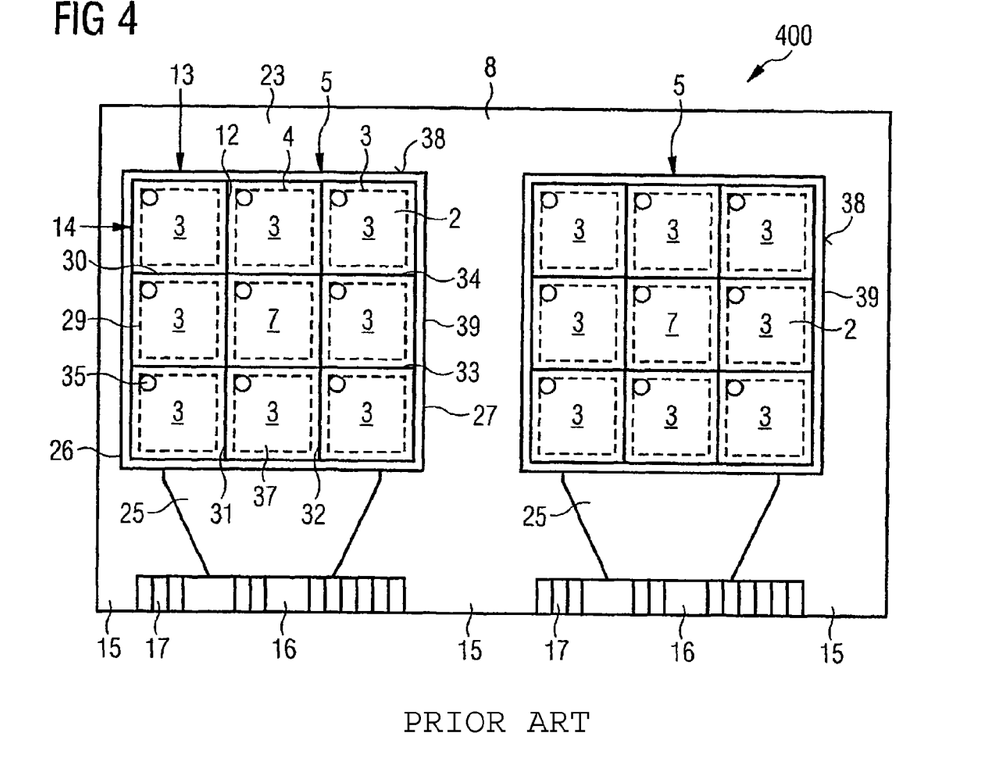
FIG. 4 shows a schematic diagram of a rewiring substrate strip with uniformly oriented semiconductor components.

FIG. 4 shows a rewiring substrate strip 400 suitable for a "burn-in" test. Not all of the external contact connections of a semiconductor component are tested during such a "burn-in" process, rather selected external contacts are connected via a rewiring substrate strip 23 to plug contact areas 17 of a plug contact strip 16 in an edge region 15 of the substrate strip 23. These external contacts 9 supply a statement about the functionality of the integrated circuits during extreme temperature cycles of between −50° C. and +150° C., by way of example. The connection between external contacts 9 and plug contact strip 16 is effected by means of a bundle 25 of rewiring lines which are partly led along sawing tracks 12 of the rewiring substrate strip 400. Rewiring area can be saved on account of rewiring lines being led in the sawing tracks 12.

In FIG. 4, the semiconductor component positions are arranged in component columns 13 and component rows 14 and a solid line 27 identifies the region 26 of a plastic covering 5 for a plurality of semiconductor components 3. The semiconductor chips 4 belonging to the semiconductor components 3 are identified by dashed-dotted lines within the plastic covering 5. The sawing tracks 12 are marked by solid lines 30 along the component columns 13 and component rows 14. Central sawing tracks 31, 32, 33 and 34 are limited in terms of their width and can therefore only take up a limited number of rewiring lines of the bundle 25 of rewiring lines that lead to the plug contact areas 17.

A marking 35 indicates in FIG. 4 that all the semiconductor components 3 in a plastic covering 5 are oriented uniformly with their external contacts. The uniform orientation has the effect that the number of rewiring lines led in the central sawing tracks 31 and 32 increases continuously in the direction of the plug contact strip 16. By way of example, if provision is made of two rewiring lines per semiconductor component and sawing track for the "burn-in" test, then the number of rewiring lines in the sawing tracks 31 and 32 in the case of the central component in the center of the plastic covering 5 already amounts to four rewiring lines in the sawing track 31. In the case of the lower component 37 closest to the plug contact strip 16, the number of rewiring lines in the sawing track 31 has then risen to six.

However, in the "burn-in" test it is usually the case that more than only two external contacts of each semiconductor component 3 to be tested are to be connected to corresponding plug contact areas 17 of the plug contact strip 16 of the substrate strip 23. The problem arises from this for a rewiring substrate strip 400 such as is known from FIG. 4 that the bundle 25 of rewiring lines, which are merely required as measuring line and are no longer used after the "burn-in" test, reduces the useable area of the substrate strip for semiconductor components 3. Consequently, the substrate strip area is not utilized optimally.

SUMMARY

One embodiment can specify a simple and cost-effective solution for making mechanical and electrical contact with semiconductor components or semiconductor modules of large scale integrated circuits for a "burn-in" test, with the intention of optimizing the line routing on the test printed circuit board in the form of a rewiring substrate strip in the available sawing tracks. A rewiring substrate strip may have a plurality of semiconductor component positions for semiconductor components which can be arranged in a plurality of component rows and component columns subdivided by sawing tracks. A plurality of semiconductor component positions can be combined to form a component group, the component group can comprise semiconductor chips of the semiconductor components on a top side of the rewiring substrate strip, and the semiconductor components of a component group can be oriented differently with respect to one another in such a way that a characteristic component edge of an individual semiconductor component can be oriented parallel to the individual sawing tracks along a component row and along a component column and the remaining semiconductor components adjoining the same sawing track can be oriented in a manner rotated by 90°, 180°, 270° relative to the semiconductor component that is oriented in parallel fashion.

BRIEF DESCRIPTION OF THE DRAWINGS

The invention will now be discussed in more detail with reference to the accompanying figures.

DETAILED DESCRIPTION

A rewiring substrate strip can be provided having a plurality of semiconductor component positions for semiconductor components. For this purpose, the rewiring substrate strip may have a plurality of semiconductor chips arranged in rows and columns in the semiconductor component positions which are brought together to form component groups and may be embedded under a common plastic covering on regions of a top side of the rewiring substrate strip. One or a plurality of such component groups can be lined up one behind another and/or one alongside another on the rewiring substrate strip. On a rear side—opposite the top side—of the rewiring substrate strip, in the component positions external contacts on external contact areas can be electrically connected to rewiring lines which are partly arranged in sawing tracks between the component positions on the rear side of the rewiring substrate strip.

The semiconductor components of such a component group can be oriented differently with respect to one another in such a way that a characteristic component edge of an individual semiconductor component is oriented parallel to the individual sawing tracks, along a component row and along a component column. The remaining semiconductor components adjoining the same sawing track can be oriented in a manner rotated by 90°, 180° or 270° with their characteristic component edge relative to the semiconductor component that is oriented in parallel fashion.

Such a rewiring strip has the advantage that the sawing tracks can be utilized in order to minimize the external contacts of the product housing and at the same time to enable an optimized test of the internal components of the integrated circuits. The external contact pads can thus be limited or reduced to the number of external contacts required for the commercial product, especially as there is no need for additional external contacts with external contact pads to be provided on each of the semiconductor components for the "burn-in" test. Nevertheless, by virtue of the rewiring lines in the sawing tracks, there are sufficient access possibilities available in order to be able to perform internal signal tests and analyses on each of the semiconductor chips during the test before the rewiring substrate strip is separated into individual semiconductor components with product housings having a minimal size.

It is furthermore possible to carry out a "burn-in" test by means of the concealed rewiring lines without placing tips onto the external contacts, in conjunction with optimized utilization of the sawing tracks between the semiconductor components. Such a rewiring strip furthermore has the advantage that nine semiconductor components with one central semiconductor component can be arranged under a plastic covering. The entire width of the four sawing tracks surrounding the central component can advantageously be used for test lines of the central component. The eight edge components are advantageously arranged in such a way that their characteristic component edges, from where the external contacts with which contact is to be made are accessed via rewiring lines, are in each case oriented with respect to the edges of the common plastic covering. This is associated with the advantage that the number of rewiring lines to be arranged in parallel fashion or one alongside another is not limited by the width of a sawing track, and the four sawing tracks that surround the central semiconductor component remain reserved for rewiring lines to the central semiconductor component.

According to an embodiment, it can be also made possible to provide four central semiconductor components which are surrounded by twelve edge components. Moreover, it may be possible to provide up to a maximum of six central components which are surrounded by fourteen edge components, so that up to twenty semiconductor components may be arranged under a plastic covering. A dedicated sawing track for rewiring lines to the external contacts to be connected can nevertheless be made available for each of the six central semiconductor components.

If, in an embodiment, nine component positions are provided under a plastic covering, then four sawing tracks are available to the central component, so that the central component may be oriented arbitrarily relative to the surrounding components. The rewiring lines can be routed to the central component from the plug contact strip in 4 directions, so that it is necessary to provide only a quarter of the test lines that are required overall per sawing track. Consequently, it is possible to further minimize the area requirement for the component group in the case of only nine semiconductor components under a plastic covering, by way of example. For this purpose, the rewiring lines in the corner regions of the characteristic component edge are arranged differently with respect to the rewiring lines of the rest of the corner regions of the semiconductor component of an assembly.

It is furthermore provided that the semiconductor chips are oriented uniformly under a common plastic covering. The arrangement of external contacts of a portion of the semiconductor components are arranged in a manner rotated with respect to one another with the aid of the rewiring structure on the rewiring strip. The rotation of the orientation of the external contacts with the aid of the rewiring structure of a rewiring substrate strip has the advantage that in the course of populating such a rewiring strip with semiconductor chips in the individual semiconductor positions, a simplification occurs in such a way that the automatic placement machine does not have to perform different orientation for the individual semiconductor chips in the individual semiconductor component positions and it is therefore possible to use standard automatic placement machines.

The external contacts on the rear side of the rewiring substrate strip may be arranged on external contact pads which, for their part, form an external contact pad matrix with external contact rows and external contact columns. For this purpose, the entire rewiring substrate area available for a semiconductor component may be populated with external contacts in a predetermined pitch. The external contacts required for a "burn-in" test are provided with rewiring lines that lead to the sawing tracks. When the semiconductor positions of a plastic covering are separated into individual semiconductor components, these rewiring lines are separated by the sawing cut, so that external contacts which are at the same potential and lie on the same common rewiring line during the "burn-in" test are subsequently separated and isolated from one another again.

Over and above the plug contact strip provided for each assembly, the rewiring substrate strip may have exposed test contact areas on its rear side outside the region of the assembly. Said test contact areas may be electrically connected to rewiring lines and/or to concealed contact pads in the sawing tracks and/or to the external contact pads of the semiconductor components and/or to contact pads on the semiconductor chip. This embodiment makes use of the fact that a rewiring substrate strip may have significantly more area for a rewiring than the region below a plastic covering, by way of example, which is limited to the semiconductor components and the sawing tracks. Moreover, test contact areas may advantageously be provided in addition on the rewiring substrate for measurements and tests that have not been provided hitherto.

A further advantage of this embodiment, in which test contact areas are connected via rewiring lines to the concealed contact pads in the sawing tracks, is to be seen in the fact that the concealed contact pads may be present having dimensions in the micrometers range, while the test contact areas outside the plastic coverings do not have to have such limited areas, so that relatively large-area test contact areas can be provided. This makes it easier to fit test tips for testing the semiconductor component and furthermore enables a situation in which no test tips whatsoever have to be placed onto the actual external contacts of the semiconductor product or the product housing. The risk of damage or deformation of external contacts of the product housing is thus largely reduced.

The abovementioned plug contact areas of a plug contact strip may be arranged both on the rear side and on the front side of the rewiring substrate strip. In this case, the plug contact areas may be electrically connected to the test contact areas and/or the concealed contact pads and/or the external contact pads. Alongside the plug contact areas provided for the "burn-in" test, further test lines may also be led from the external contact pads of the component positions to the plug contact strip.

It is thus possible to carry out further tests, such as internal signal tests and analyses, by means of the plug contact areas of the plug contact strip. The embodiment of such plug contact strips makes it possible to dispense with fitting the finished semiconductor components on separate test substrates for "burn-in" tests and/or for signal tests and/or signal analysis tests and to enable both "burn-in" tests and signal tests simultaneously for a plurality of semiconductor components under a common plastic covering on a common rewiring substrate strip.

It is furthermore provided that the rewiring substrate strip has stacks comprising at least one logic chip and/or a memory chip in the semiconductor component positions, both the memory functions of the memory chips and the logic functions of the logic chips being able to be tested via the exposed test contact areas and/or the test contacts and/or the plug contact areas. Particularly in the case of memory chips having a high storage density of more than several hundred megabytes through to the gigabytes range, it is of importance that such complex stacks comprising a memory chip and a logic chip can be tested in detail with the rewiring substrate strip according to an embodiment before such complex stacks of semiconductor component structures are actually delivered.

This increases the reliability of manufacturing and of semiconductor components and reduces the rejects rate of semiconductor components on a rewiring substrate strip according to an embodiment. Such comprehensive tests are possible by means of the abovementioned additional test areas on the rewiring substrate according to an embodiment.

A semiconductor component can be formed by separation of the rewiring substrate strip according to an embodiment. Such a semiconductor component differs from conventional semiconductor components by virtue of the fact that tracks of severed rewiring lines occur on its edge sides. In order to avoid corrosive attacks on the severed rewiring lines at the edge sides, the edge sides may have an insulating synthetic coating in one preferred embodiment of the semiconductor components. For this purpose, it is sufficient to apply thin lacquer layers to the edge sides.

A method for producing rewiring substrate strips having a plurality of plastic coverings on its top side which have semiconductor component positions with semiconductor chips that are arranged in rows and columns has the following method steps. Firstly, a substrate strip coated with metal on both sides is provided. Such a substrate strip may comprise a synthetic resin sheet or plate in strip form that is metallized on both sides, or a multilayer substrate sheet with metal interlayers and/or through contacts. While the top side of the substrate strip is provided for semiconductor chips in a semiconductor component position with contact connection areas for flip-chip contacts or for bonding connections, a rewiring structure with external contact pads in the semiconductor component positions is applied on the rear side of the substrate strip.

Concealed contact areas and/or rewiring lines are arranged in the region of sawing tracks between the semiconductor component positions. Furthermore, plug contact areas are provided in the edge regions of the rewiring substrate strip for each component group. Rewiring lines are simultaneously realized between external contact pads, concealed contact pads, test contact areas, if provided, and/or plug contact areas.

In the course of applying a rewiring structure in this way, care is taken to ensure that the arrangements of the external contact pads which are later intended to carry external contacts are oriented differently in each of the component position and are rotated relative to one another by 0° and/or 90° and/or 180° and/or 270° with respect to one another. In a corresponding manner, the semiconductor chips may in the same way also be rotated by 0° and/or 90° and/or 180° and/or 270° with respect to one another and be applied to the semiconductor component positions. For this purpose, corresponding connections between semiconductor chips and their rewiring structure are produced via corresponding contact connection areas.

Furthermore, the semiconductor chips can be embedded in a plastic housing composition by application of a plastic covering, in which case the number of semiconductor chips in a component group under a plastic covering may be at least twenty-nine semiconductor chips. The feature according to an embodiment that only a characteristic component edge of an individual semiconductor component is oriented parallel to the individual sawing tracks can be complied with even when there is a number of twenty semiconductor chips in an assembly. In the design of the rewiring structure and/or during the application of the semiconductor chips, care is taken to ensure that only one characteristic edge side of a semiconductor chip is oriented with respect to each planned sawing track, while the remaining semiconductor chips of a component row or a component column are correspondingly rotated by 90° and/or 180° and/or 270°, thereby ensuring that only one characteristic edge side of a semiconductor component adjoins each sawing track.

After the arrangement or application of the semiconductor chips and the structuring of the substrate strip, external contacts in the semiconductor component positions are applied to the external contact pads of the rewiring structure on the rear side of the rewiring substrate strip. Since the external contacts are connected via rewiring lines to different test areas such as the plug contact areas and/or the concealed contact areas and the functional tests and the temperature hardness tests can in each case be carried out from there, the external contacts on the external contact areas per se are not burdened by the test operation, so that the next step involves carrying out functional tests of the semiconductor chips embedded in the plastic coverings whilst making contact with the plug contact areas and/or the test contact areas. After this has been carried out, defective semiconductor components on the rewiring substrate strip within the respective plastic covering are identified and marked.

This method has the advantage that on account of the additional plug contact areas and/or the test areas on the rear side of the rewiring substrate strip or in the edge region of the rewiring substrate strip, functional tests of the semiconductor chips can be carried out completely, but without having to make contact with the external contacts on the rewiring substrate strip. Furthermore, this method has the advantage that it is also possible to test the internal signal processing in the semiconductor chips arranged to form assemblies, without requiring additional external contacts for the product housing.

This method can therefore be used to produce components which have housings reduced in size, in conjunction with a reduction of the number of external contacts, and which can nevertheless be subjected to a complete functional test for the internal signal processing as well. The arrangement of the plug contact areas furthermore permits "burn-in" test cycling. The semiconductor components can thus be tested under extreme temperature cycle loading before the component groups are actually separated into individual semiconductor components.

These advantages, namely the careful treatment of the external contacts of the product housing, the possibility of testing and analyzing internal signal profiles, of all the semiconductor chips, and the testing of each component group with a plurality of semiconductor components within the plastic covering, for example, under extreme temperature fluctuations become possible in this method according to an embodiment with the aid of the rewiring strip according to an embodiment.

Instead of sawing tracks which permit only a limited number of concealed contact areas, which also have dimensions in the micrometers range, it is possible, in a further method, to provide sawing strips on which are arranged test areas and/or test contacts which are partly connected to the external contact areas via rewiring lines. These sawing strips are sawn out during singulation of the semiconductor components, so that the product housing remains small since the test contacts are removed together from the so-called debug housing having sawing strips.

A further method variant provides for the semiconductor chips to be applied to the top side of the rewiring substrate strip in a manner oriented uniformly and in standard fashion. For the rewiring structure, however, on the rewiring substrate strip it is provided that, in the semiconductor component position, the orientation of the arrangement of external contacts are rotated by 0° and/or 90° and/or 180° and/or 270° relative to the orientation of the semiconductor chips. This method has the advantage technically that when semiconductor chips are being mounted, the orientation of the external contacts of the semiconductor components does not have to be taken into consideration, so that the semiconductor chips can be applied totally uniformly by a standard automatic placement machine, while the arrangement of the external contacts is preprogrammed and constructively rotated relative to the arrangement of the semiconductor chips in the case of the design of the rewiring substrate strip from a multilayer substrate strip in order to use the sawing tracks optimally for the rewiring lines to corresponding test areas. In this case, a predetermined rotation and also the arrangement of the semiconductor chips in the x and y directions are carried out according to a predetermined rewiring plan for the rewiring strip.

In a further method variant, the application of differently oriented and arranged semiconductor chips on the rewiring substrate strip is achieved by making available a semiconductor wafer having semiconductor chips which are separated out from the semiconductor wafer and are oriented and arranged in preparatory fashion in x and y arrangement and also in rotational orientation. The semiconductor chips which are thus already arranged on the wafer in a predetermined x, y and rotational orientation according to a predetermined plan are subsequently transferred onto the rewiring substrate strip by a standard automatic placement machine, said strip retaining the arrangement and orientation of the semiconductor chips predetermined by the wafer.

In a further method variant, the application of differently oriented and arranged semiconductor chips on the rewiring substrate strip is achieved by making available a sheet or a transport belt with semiconductor chips having different orientations which have semiconductor chips oriented and arranged in preparatory fashion in x and y arrangement and/or in rotational orientation. In this case too, a standard automatic placement machine can take up the semiconductor chips and transfer them in predetermined arrangement and orientation on the rewiring substrate strip.

In a further method variant, the application of differently oriented and arranged semiconductor chips on the rewiring substrate strip is achieved by virtue of the fact that the separated semiconductor chips of a wafer or of a sheet have a standard arrangement and orientation and an automatic placement machine is used which carries out both the x and y arrangement and the rotational orientation according to a predetermined plan. Such automatic placement machines are constructed with a relatively complex structure, but make it possible to obviate the need to make available either a special rewiring substrate strip or specially prepared sheets or correspondingly topographically newly configured semiconductor wafers.

Semiconductor chips with flip-chip contacts can be arranged in the component groups of the rewiring substrate strip. This has the advantage that it is possible to produce semiconductor components without a mold cap. If semiconductor chips with bondable contact areas on their active top sides are used for populating the rewiring substrate strip, then the semiconductor chips are firstly applied by their rear sides on the top side of the rewiring substrate strip and the electrical connections between semiconductor chip and rewiring substrate strip are subsequently produced by bonding. Afterward, the assemblies with semiconductor chips and with the associated bonding connections are provided with a plastic covering, which, assembly by assembly, embed the semiconductor chips and the bonding connections in a plastic housing composition.

In order to reduce the risk of oxidation and to enable reliable contact-making, the test contact areas and/or the plug contact areas and/or the external contact pads of the rewiring substrate structure may be selectively coated with a gold alloy. As test contacts, test solder balls are preferably soldered onto the test contact areas. Said test solder balls, too, are no longer part of the product housing after the removal of the sawing strips, so that the product housing can be made correspondingly small. Said test solder balls serve for the functional testing of the packaged semiconductor chips and are not provided as external contacts of the product housing.

In order to produce semiconductor components, on the basis of the rewiring substrate strip according to an embodiment, after a functional test has been performed, separation into individual semiconductor components whilst sorting out the marked defective semiconductor components is carried out. The separation may be effected by means of sawing technology. This gives rise to components having, on their edge sides, tracks of solid rewiring lines, which can be protected by applying a plastic housing layer to the edge sides.

Thus, on the substrate strip can be implemented in addition to the external contacts in the form of solder balls, on the housing further contact locations in the form of plug contact strips and plug contact areas contact locations for the "burn-in" test or else for the "strip test". As contact location, the plug contact strip is inserted onto an edge region of the substrate strip, preferably for the "burn-in" test or else for additional test areas on the substrate strip outside the so-called "mold cap" or the plastic covering.

The rewiring for said additional plug contact areas and/or test contact areas is routed within the sawing frame of the substrate. The number of lines that can be realized in this case is limited by the width of the sawing strip, by the design rules of the rewiring substrate and the number of available layers within the rewiring substrate. It is possible nevertheless to utilize an available space on the rewiring substrate strip below the mold cap or the plastic covering for additional test areas or test balls. Instead of the rewiring in the sawing tracks, it is possible to provide additional areas in a sawing strip directly alongside the semiconductor chip for additional soldering balls and contact areas. Such a sawing strip is finally removed through additional sawing tracks.

These embodiments are based on a very small number of required lines; signal and supply lines may in this case be combined in part to form a rewiring line within the sawing tracks. In the case of rewiring structures which are provided for the "burn-in" test, the necessary external contact connections in the case of the plug contact design and/or in the case of the rewiring substrate design can be provided, and combined, as close as possible to one of the margins of the semiconductor chip and/or to a characteristic component edge of the semiconductor components. For this purpose, the chips are as far as possible applied on the substrate such that the connections necessary for testing or for "burn-in" lie close to the external contacts of the mold cap or the plastic covering. In this case, unlike previously, all the components are no longer oriented in one direction but rather rotated by 90°, 180° or 270°, according to the requirements, such that only one characteristic component edge points to a sawing track.

If the contact areas or the soldering balls are used only for test, debug and analysis purposes on the substrate strip, the adjacent area outside the mold cap may additionally be provided for test contacts and the edge sides may be provided for plug contacts. In this case, the additional contact areas and soldering balls may also be provided only at one or two margins of the semiconductor chips. The area that can be additionally utilized can thus be extended by rotating the components.

As a result of combining the required test "burn-in" connections at one of the chip margins and also as a result of rotating the chips and/or as a result of rotating the arrangement of the external contacts on the substrate, a reduced wiring demand is placed in the sawing frame, whereby the sawing tracks can be minimized. Furthermore, as a result of rotating the semiconductor chips and/or the external contact arrangement, and also partly placing the solder balls or the contact areas in the region outside the mold cap, the available area for the semiconductor components will be increased. These measures can be implemented simultaneously or separately in order to optimize the utilization of the substrate and the utilization of the sawing tracks.

Figure 1:
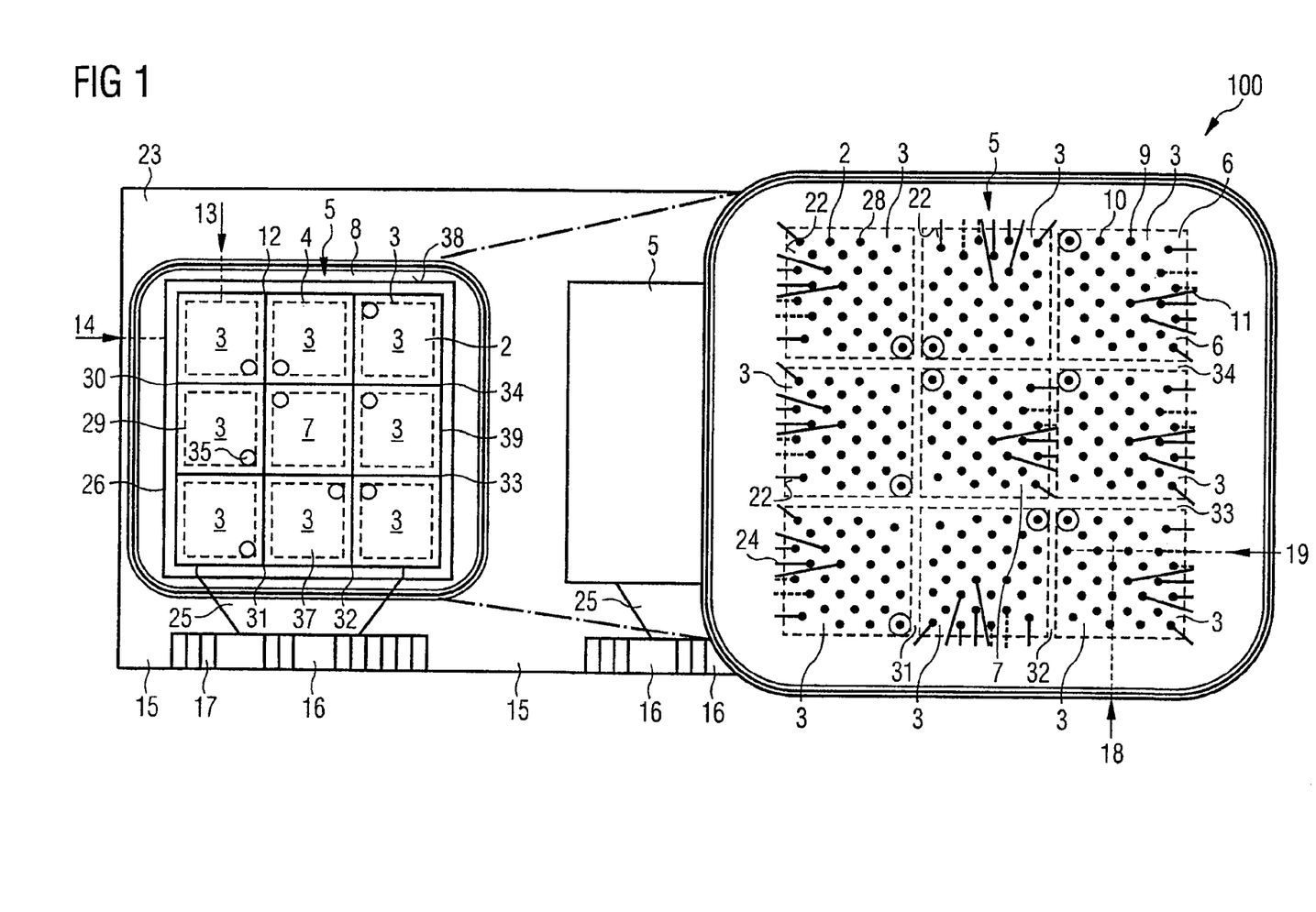
FIG. 1 shows a schematic diagram of a first embodiment with nine semiconductor components under a plastic covering.

FIG. 1 shows a schematic plan view and, in an enlargement, a schematic rear side view of a rewiring substrate strip 100 of a first embodiment. The plan view arranged on the left-hand side of FIG. 1 shows the arrangement of semiconductor chips 4 under a common plastic covering 5. The enlarged rear side view of the rewiring substrate strip 100 that is arranged on the right-hand side shows the arrangement of external contacts 9 on external contact pads 10 in external contact rows 19 and external contact columns 18.

Since the semiconductor chips 4 are embedded in a plastic covering 5 in the plan view on the left-hand half of FIG. 1, their contours are identified by dash-dotted lines 29. The semiconductor components 3 are arranged in component rows 14 and component columns 13 and have a central component 7 in the center, said central component being surrounded by eight further semiconductor components 3. A marking 35 on each of the semiconductor components 3 is intended to show the position of the arrangement of the external contacts 9 situated on the underside or rear side 6, the semiconductor components 3 or the arrangement of the external contacts 9 of the semiconductor components 3 being arranged differently with respect to one another.

The different arrangement may also apply to the orientation of the semiconductor chips 4 on the top side 8 of the rewiring substrate strip 100. However, it is also possible for the semiconductor chips 4 on the top side 8 of the rewiring substrate strip 100 to be oriented uniformly, as is shown in the prior art in FIG. 4, while the arrangements of the external contacts 9 on the rear side 6 of the rewiring substrate strip 100 are oriented differently. In FIG. 1 eight surrounding semiconductor components 3 therein are oriented with a characteristic edge side 22 in each case with respect to the edge 38 of the plastic covering, while the characteristic side 22 of the central semiconductor component 7 is oriented parallel to the central sawing track 32. The rest of the central sawing tracks 31, 33 and 34 are thus kept free of rewiring lines 11 and are available for larger units of plastic coverings 5.

The rewiring lines 11 of the individual components 3 that run outside the region 26 of the plastic covering 5 and the rewiring lines that run on the central sawing track 32 are combined to form a bundle 25 of rewiring lines outside the region 26 of the plastic covering 5 and are distributed for a "burn-in" test between the plug contact areas 17 of the plug contact strip 16 in the edge region 15 of the rewiring substrate strip 100. Consequently, during the "burn-in" test, selected contacts can be connected to evaluation and test circuits via the plug contact strip without the application of measuring tips, while the entire rewiring substrate strip 100 is tested in a corresponding furnace that generates both negative temperatures and high temperatures of between −50° C. and +150° C.

For this purpose, external contacts 9 that are to be supplied with the same potential can be brought together to a rewiring line in the edge region of the plastic covering or in the central sawing track 32, so that the "burn-in" test can be carried out with a minimal number of rewiring lines 11. The external contacts 9 have solder balls 28 in this embodiment.

Figure 2:
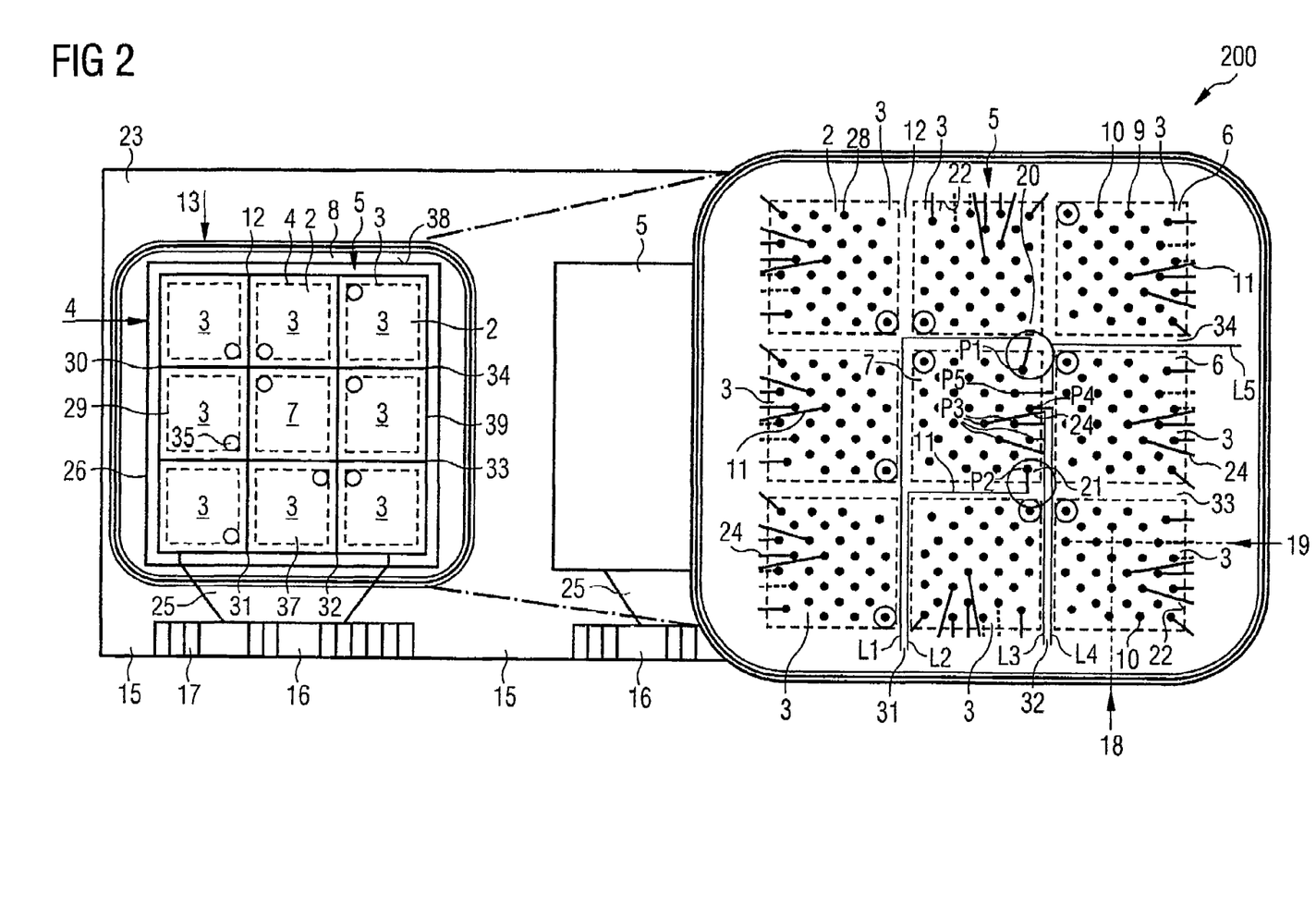
FIG. 2 shows a schematic diagram of a second embodiment likewise with nine semiconductor components under a plastic covering, but with changed rewiring routing around the central semiconductor component.

FIG. 2 shows a schematic diagram of a rewiring substrate strip 200 of a second embodiment, wherein a plan view of the plastic covering 5 can once again be seen in the left-hand region of FIG. 2 and an enlargement of the rear side with the arrangement of the external contacts 9 is illustrated on the right-hand side of FIG. 2. Components having functions identical to those in FIG. 1 are identified by the same reference symbols and are not discussed separately.

The difference between the first embodiment and the second embodiment resides in the rewiring line routing or the different rewiring structures 24. Whereas in the first embodiment only a single central sawing track is employed and used for laying the rewiring lines to the external contacts of the central component 7 that are to be tested, the rewiring lines L1 to L5 are distributed between the central sawing tracks 31, 32 and 34. Consequently, the five rewiring lines L1 to L5 that are shown here and are required for the "burn-in" test in order to connect the external contacts P1 to P5 to the corresponding rewiring lines L1 to L5 may be distributed in such a way that only two rewiring lines are arranged in a respective sawing track. For this purpose, the connections in the corner regions 20 and 21 of the central semiconductor component are routed differently relative to the regions of the semiconductor components 3 in the edge region.

Figure 3:
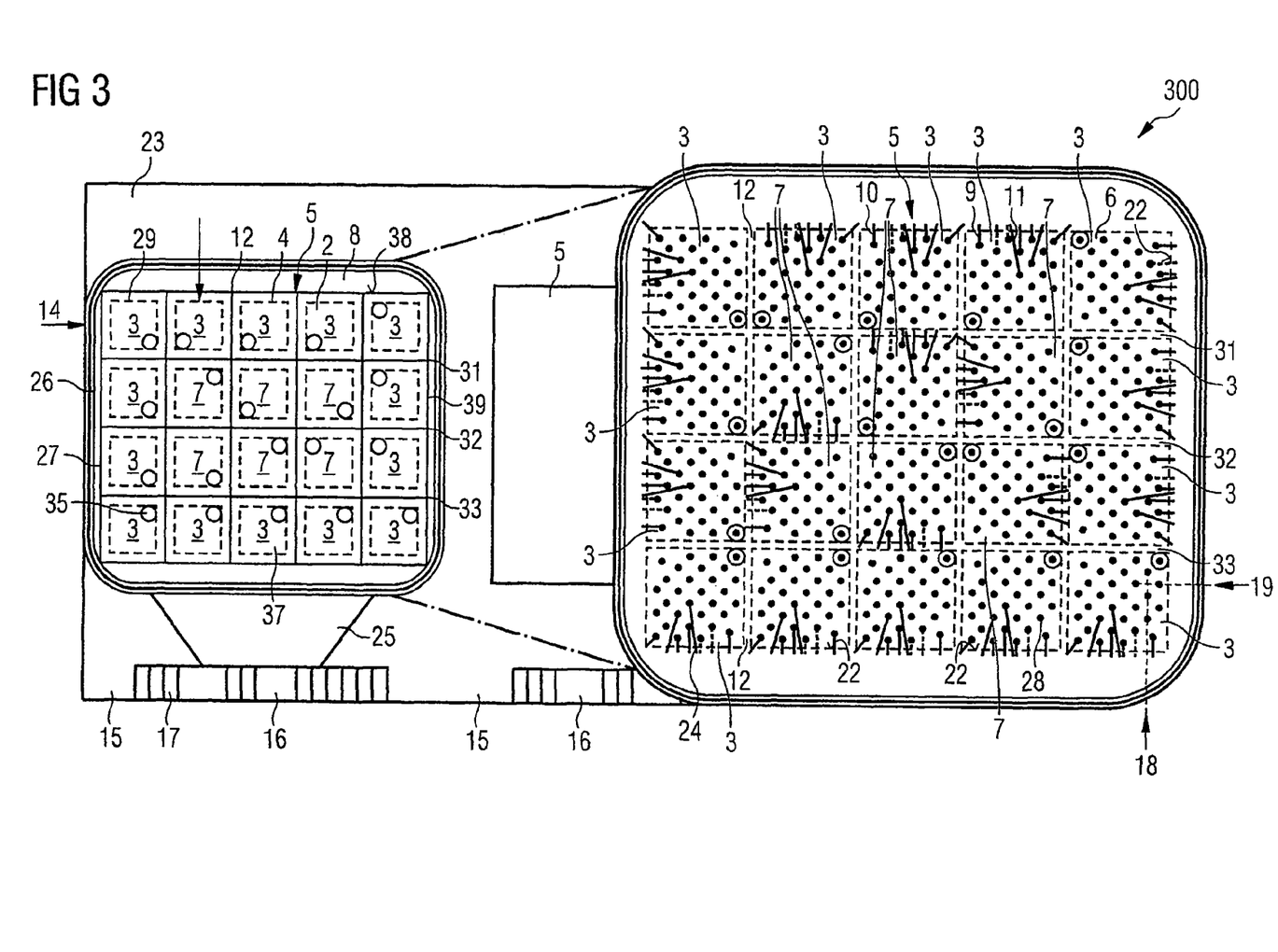
FIG. 3 shows a schematic diagram of a third embodiment with six central semiconductor components and fourteen surrounding components under a common plastic covering.

FIG. 3 shows a schematic diagram of a rewiring substrate strip 300 of a third embodiment. Components having functions identical to those in the previous figures are identified by the same reference symbols and are not discussed separately.

One half of FIG. 3 once again shows a plan view of a plastic covering 5, in which twenty semiconductor components 3 are provided, and the right-hand half of the illustration of FIG. 3 shows the corresponding rear side with external contact arrangements of such a plastic covering position of the rewiring strip 300. This third embodiment has six central semiconductor components 7. In this case, the principle that only one characteristic edge side 22 of a semiconductor component is arranged parallel to a sawing track 12 is realized in the case of this embodiment as well.

For this purpose, the semiconductor components 3 are oriented differently with respect to one another and rotated in such a way that the rest of the semiconductor components adjoining a sawing track 12 are oriented in a manner rotated by 90°, 180° or 270°, so that the principle can be complied with. If the number of components is increased to 25 thereof, then the problem arises that the principle can no longer be complied with and, at least on one sawing track 12, two characteristic edges then occur parallel to a sawing track. If permitted by the sawing track width and/or crossovers by multilayer rewiring substrate strips are permissible, the number of semiconductor components under a common plastic covering can be increased as desired without taking up additional areas of the rewiring substrate strip 300.

What is claimed is:

1. A rewiring substrate strip having a plurality of semiconductor component positions for semiconductor components which are arranged in a plurality of component rows and component columns subdivided by sawing tracks, the plurality of semiconductor component positions being combined to form a component group, the component group comprising semiconductor chips of the semiconductor components on a top side of the rewiring substrate strip, and a portion of the semiconductor components of the component group being oriented differently with respect to one another in such a way that a characteristic component edge of an individual semiconductor component is oriented parallel to the individual sawing tracks along either the component rows or along the component columns, and various subsets of a portion of the remaining semiconductor components adjoining the same sawing track are oriented in a manner rotated by 90 degrees, 180 degrees, and 270 degrees, respectively, relative to the semiconductor component that is oriented in parallel fashion.

2. A rewiring substrate strip according to claim 1, wherein the plurality of semiconductor component positions comprises nine semiconductor component positions with one central semiconductor component position and eight edge positions arranged in the component group, the edge positions being oriented in such a way that their characteristic component edges are oriented in the direction of outer margins of the component group and the central semiconductor component assumes an arbitrary orientation.

3. A rewiring substrate strip according to claim 2, wherein rewiring lines in some corner regions of the semiconductor components and of the characteristic component edge of the central semiconductor component are arranged differently with respect to rewiring lines of the rest of the corner regions of the semiconductor components.

4. A rewiring substrate strip according to claim 1, wherein a plurality of component groups are lined up one behind another or one alongside one another on the rewiring substrate strip and have one or a plurality of plastic coverings.

5. A rewiring substrate strip according to claim 1, wherein the semiconductor chips are oriented uniformly in the component group and the arrangement of external contacts of a first subset of the semiconductor components have an orientation that is rotated with respect to a second subset of the external contacts.

6. A rewiring substrate strip according to claim 1, wherein in the semiconductor component positions, external contact pads having external contacts are arranged in an external contact pad matrix with external contact rows and external contact columns.

7. A rewiring substrate strip according to claim 1, wherein the rewiring substrate strip comprises a plug contact strip with plug contact areas in an edge region, the plug contact areas being electrically connected to test contact areas, to concealed contact pads, or to the external contact pads.

8. A rewiring substrate strip according to claim 7, wherein the plug contact strip is provided on a rear side or the top side of the rewiring substrate strip.

9. A rewiring substrate strip according to claim 1, wherein there are arranged on a rear side—opposite the top side—of the rewiring substrate strip concealed contact pads or concealed conductor tracks in the sawing tracks between the semiconductor component positions on the rear side, which are electrically connected to external contacts of the semiconductor components.

10. A rewiring substrate strip according to claim 1, wherein the rewiring substrate strip comprises regions with exposed test contact areas on a rear side of the rewiring substrate strip outside a region of the component group, the test contact areas being electrically connected to rewiring lines, to concealed contact pads in the sawing tracks, to external contact pads of the semiconductor components, or to contact pads on the semiconductor chips.

11. A rewiring substrate strip according to claim 1, wherein the rewiring substrate strip comprises plug contact areas, and the rewiring substrate strip comprises stacks comprising at least one logic chip and/or a memory chip in the semiconductor component positions, both the memory function of the memory chip and the logic function of the logic chip being configured to be tested via the exposed test contact areas, the test contacts, or the plug contact areas.

12. A semiconductor component which is formed by separation of the rewiring substrate strip as claimed in claim 1 and comprising tracks of severed rewiring lines on its edge sides.

* * * * *